United States Patent [19]

Konishi

[11] Patent Number: 5,138,316

[45] Date of Patent: Aug. 11, 1992

[54] VARIABLE LENGTH CODE DEMODULATING APPARATUS AND ADDRESS CONTROL METHOD THEREOF

[75] Inventor: Kazuo Konishi, Kanagawa, Japan

[73] Assignee: Kabushiki Kaisha Toshiba, Kawasaki, Japan

[21] Appl. No.: 604,175

[22] Filed: Oct. 29, 1990

[30] Foreign Application Priority Data

Oct. 30, 1989 [JP] Japan ................... 1-283468

[51] Int. Cl.⁵ ............................................. H03M 7/40
[52] U.S. Cl. ...................... 341/67; 341/106; 358/261.1
[58] Field of Search .............. 341/66, 67, 59, 55, 341/51, 87, 95, 106; 358/261.1, 261.2, 427, 261.4

[56] References Cited

U.S. PATENT DOCUMENTS 4,276,544 6/1981 Iinuma ............................. 341/67
4,593,267 6/1986 Kuroda et al. ................... 341/67

FOREIGN PATENT DOCUMENTS 63-525758 3/1988 Japan .

OTHER PUBLICATIONS

Fukinuki, T. "Multidimensional Processing of TV Pictures", Nikkan Kogyo Shinbunsha, Jun. 25, 1984, pp. 225-226; 252-260 (with English translation).

Fukinuki, T. "Digital Signal Processing for Video Image" (Huffman Code), NDC 548.8, May 25, 1971, p. 257 (with English translation).

*Primary Examiner*—A. D. Pellinen
*Assistant Examiner*—Brian K. Young
*Attorney, Agent, or Firm*—Foley & Lardner

[57] ABSTRACT

In a variable length code demodulating apparatus, a bit length of the variable length code is examined to determine if it is longer than a specified bit length. The most significant bits equal in number to the specified bit length is selected from variable length codes which have a bit length exceeding the specified bit length. The most significant bits of the variable length code are converted to a conversion code which replaces the most significant lists. The conversion code has a bit length less than the specified bit length. An addressing to a conversion table in which each fixed length code is stored corresponding to each variable length code is performed on the basis of the least significant lists and the conversion code substituting for the most significant lists.

10 Claims, 3 Drawing Sheets

VARIABLE LENGTH CODE DEMODULATING APPARATUS AND ADDRESS CONTROL METHOD THEREOF

BACKGROUND OF THE INVENTION

1. Field of the Invention

The present invention relates, in general, to a variable length code demodulating apparatus. In particular it relates to a variable length code demodulating apparatus suited for image data compression.

2. Description of the Related Art

Recently, some remarkable progress has been made in image data compression techniques. In such image data compression techniques, in order to raise the efficiency of digital transmission and recording etc., the image data is encoded with a smaller bit rate. Examples of this technique are the predictive coding technique and transform coding technique, etc. These techniques are described in detail in "Multidimensional Processing of TV Pictures", by T. Fukinuki, published by Nikkan Kogyo Shinbunsha, Jun. 25, 1984, incorporated herein by reference. In addition, a further image data compression can be achieved by performing variable length encoding on the code compressed by such encoding processes. The variable length encoding consists in varying the encoded bit width in accordance with the frequency of occurrence of the code. By this means, a smaller bit rate can be obtained than with fixed length coding.

Next, as an example of variable length coding, a description will be given with reference to FIGS. 3a and 3b of a method of generating Huffman codes. Let us know assume that t fixed length codes $S_1, S_1, \ldots S_t$ are converted into Huffman codes. FIGS. 3a and 3b show an example for the case where $t=6$. First of all, these codes $S_1$ to $S_6$ are arranged in order of the magnitude of the frequency of their occurrence (the probability of occurrence). The probabilities of occurrence of codes $S_1$ to $S_6$ are respectively 0.35, 0.20, 0.15, 0.15, 0.10 and 0.05 as shown in FIG. 3a. They are therefore arranged in the order of codes $S_1$ to $S_6$. Next, taking the two codes whose probability of occurrence is smallest as one group, their composite probability (the sum of the two probabilities of occurrence) is found. In FIG. 3a, codes $S_6$ and $S_5$ have the smallest probability of occurrence, and their composite probability is 0.15. Next, this group and the other codes are arranged in order of magnitude of their probabilities of occurrence (or composite probability). The two codes (or groups) whose probability of occurrence (or composite probability) is smallest are taken as a new group, and the composite probability of this group is found. Subsequently, this process is repeated until a relisting with the composite probability of 1 has been effected as shown in FIG. 3a.

Next, using FIG. 3a, a code tree as shown in FIG. 3b is compiled. "0" and "1" are then allocated in accordance with the branching of this code tree. In FIG. 3b, the upper branches are allocated "0", while the lower branches are allocated "1". The Huffman codes are obtained by following this branching. For example, as shown by the thick line in FIG. 3b, the fixed length code $S_4$ passes along a branch "0", along a branch "1", and finally along a branch "0", so it is converted to the Huffman code "010". The Huffman codes of the codes $S_1$ to $S_{s6}$ found in this way are shown in Table 1 below.

TABLE 1

| Code | Huffman code | Code | Huffman Code |
|---|---|---|---|
| $S_1$ | 00 | $S_4$ | 010 |
| $S_2$ | 10 | $S_5$ | 0110 |
| $S_3$ | 11 | $S_6$ | 0111 |

As shown in Table 1, codes whose probability of occurrence is high are converted into Huffman codes of short bit length, while codes whose probability of occurrence is low are converted into Huffman codes of longer bit length. In this way, the overall bit rate can be reduced.

In general, to demodulate such variable length code into fixed length code, a conversion table embedded in a solid state memory such as a ROM is used. In FIG. 3a, for convenience in explanation, the maximum bit number of the variable length code (huffman code) was taken as being 4 bits, but, in an actual image data signal, the maximum bit number is very large, for example, 15 bits.

Accordingly, some proposals have been made to reduce the capacity of the conversion table. As an example, this type of variable length code demodulating apparatus is described in Japanese Patent Disclosure (Kodai) No. 63-52578. This technique discloses that the bit length of coded data which is input is set as one n-th of the maximum bit length of coded data, and the conversion table is read out n times. Thus, the capacity of the conversion table can be reduced.

In the variable length code demodulating apparatus described above, however, a Run-Length code is used in which two values are employed consisting of while and black. Such a technique requires a long transaction time for conversion due to numerous read outs of the conversion table.

SUMMARY OF THE INVENTION

Accordingly, it is an object of the present invention to provide an improved variable length code demodulating apparatus wherein the capacity of the conversion table can be reduced.

It is a further object of the present invention to provide a variable length code demodulating apparatus which is capable of shortening the conversion time.

It is still a further object of the present invention to provide a variable length code demodulating apparatus wherein the circuit size can be reduced, without deterioration in performance.

In accordance with the present invention, the foregoing objects are achieved by providing a variable length code demodulating apparatus including a converting means and a conversion table. The converting means converts the most significant bits, having a selected bit length, of the variable length code into a conversion code having a bit length smaller than the selected bit length. The conversion table has address inputs and is connected to receive the least significant bits of the variable length code as least significant bit address inputs thereto. The conversion table is further connected to receive the conversion code as most significant bit address inputs thereto. The conversion table generates a fixed length code smaller than the maximum bit length of the variable length code as its fixed bit output code.

BRIEF DESCRIPTION OF THE DRAWINGS

These and other objects and advantages of this invention will become more apparent from the following detailed description of the presently preferred embodiment of the invention, taken in conjunction with the accompanying drawings of which:

FIGS. 3a and 3b are diagrams given in explanation of the Huffman codes wherein FIG. 3a shows the process of generating Huffman code, and FIG. 3b, shows a Huffman code tree.

DETAILED DESCRIPTION OF THE PREFERRED EMBODIMENTS

The preferred embodiment of the present invention will now be described in more detail with reference to the accompanying drawings.

Figure 1:
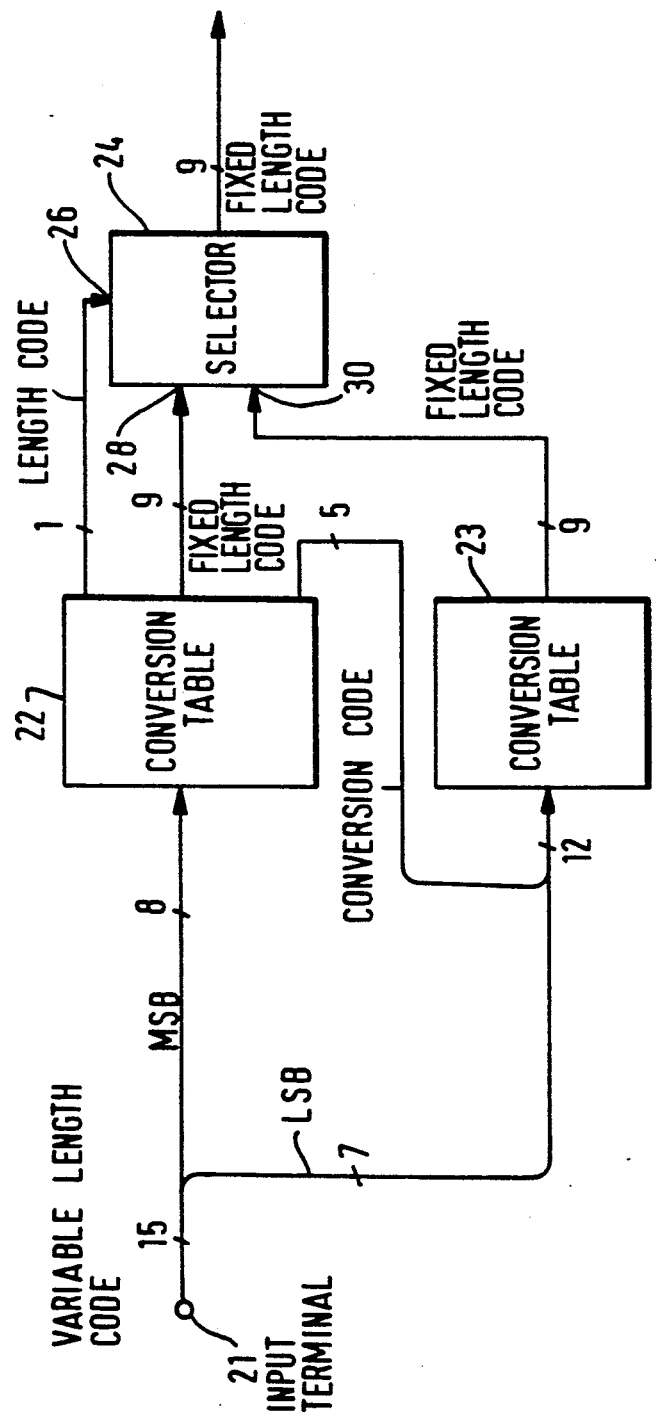
FIG. 1 is a basic block diagram of the variable length code demodulating apparatus according to the present invention.

In FIG. 1, at an input terminal 21, there is input a variable length code of, for example, a maximum bit number of 15 bits. The most significant 8 bits of this variable length code are supplied to an address input terminal of a conversion table 22, while the least significant 7 bits are supplied to an address input terminal of a conversion table 23. The addresses in the conversion tables 22 or 23 are specified by the data that is input at the address input terminal, and the data stored at the designated address is output.

The conversion table 22 has addresses corresponding to all variable length codes of 8 bits or less. At each of these addresses, there is respectively stored a fixed length 9-bit code corresponding to each of these variable length codes of 8 bits or less. The conversion table 22 also has addresses corresponding to the most significant 8 bits of variable length codes of 9 bits or more. At these addresses, there are stored 5 bit conversion codes respectively corresponding to these variable length codes. In addition, the conversion table 22 has a region that stores a 1-bit length code. If this length code is "1", this indicates that the variable length code is 8 bits or less. If it is "0", this indicates that the variable length code is longer than 8 bits. Thus, the conversion table 22 is constituted by $2^8 \times (9+5+1)$ bits.

As will be clear from the above example of Huffman coding, the most significant n bits of a variable length code of bit length longer than n bits (where n is a natural number) are necessarily different from the patterns of variable length codes of n bits or less. For example, in the Huffman codes of Table 1 above, the patterns "00", "10" of the Huffman codes of $S_1$ and $S_2$ are not present in the most significant 2 bits of the Huffman codes of $S_3$, $S_4$, $S_5$ and $S_6$. Consequently, by using variable length codes of 8 bits or less or the most significant 8 bits of a variable length code of 9 bits or more to designate different addresses, a length code can be obtained whereby it is possible to determine, from its address, whether or not the variable length code is 8 bits or less. In fact, the number of patterns of the most significant 8 bits of variable length codes of 9 bits or more is comparatively small. Although there are some differences depending on the system, these patterns can be adequately distinguished by 5 bits (32types). For this reason, in this embodiment, the bit number of the conversion code is set at 5 bits.

Thus, the conversion table 22 outputs the length code (1-bit) to a control input terminal 26 of a selector 24. The conversion table 22 also outputs the fixed length code to the other input terminal of the selector 24. The conversion table 22 outputs the 5-bit conversion code as the most significant bits of the address of a conversion table 23. Thus, the conversion table 22 supplies the 5-bit code to the address input terminal of the conversion table 23, together with the least significant 7 bits from the input terminal 21.

On the other hand, the conversion table 23 has addresses corresponding to these 12 bit codes. At each address, there is stored a fixed length 9-bit data code corresponding to the variable length input code of 9 bits or more. Thus, the conversion table 23 is constituted of $2^{12} \times 9$ bits. The conversion table 23 outputs the fixed length code stored at the designated address to a second input terminal 30 of the selector 24. The selector 24 is arranged such that, when a length code "1" is input, it outputs the fixed length code that was input at the first input terminal 28 (coming from conversion table 22), while, when a length code "0" is input, it outputs the fixed length code that was input at the second input terminal 30 (coming from conversion table 23).

Next, the operation of the variable length code demodulating apparatus constructed as above will be described.

A variable length code of 15 bits is input through the input terminal 21. The most significant 8 bits of the variable length code are supplied to the conversion table 22. The least significant 7 bits are input at the address input terminal of the conversion table 23 as the least significant bits of the 5-bit conversion code from the conversion table 22. Now assume that the variable length code is constituted by 8 bits or less. In this case, a length code "1" is output by the conversion table 22 to the control input terminal 26 of the selector 24. Furthermore, the 9-bit fixed length code stored at the address indicated by this variable length code is output by the conversion table 22 to the first input terminal 28 of the selector 24. Since the selector 24 inputs "1" at its control input terminal 26, it outputs the fixed length code at the first input terminal 28.

In contrast, if the variable length code is constituted by 9 bits or more, a length code "0" is output by the conversion table 22. The conversion table 22 outputs the 5-bit conversion code stored at the address corresponding to the most significant 8 bits. Thus, a 12-bit code is supplied to the address input terminal of the conversion table 23. The address of the conversion table 23 is thereby designated, and the 9-bit fixed length code corresponding to the variable length code of 9 bits or more is output to the second input terminal 30 of the selector 24. Since the selector 24 inputs "0" at its control input terminal 26, it outputs the fixed length code from the second input terminal 30. The total bit number of the conversion tables is $2^8 \times 15 + 2^{12} \times 9 = 40$ (k bits), which is reduced to less than 1/7 of that used conventionally. Thus, the circuit size can be greatly reduced.

In this embodiment, the patterns of the most significant 8 bits of variable length codes of 9 bits or more are necessarily different from the patterns of variable length codes of 8 bits or less. Furthermore, the number of these patterns is extremely small. Therefore, the most significant 8 bits of variable length codes of 9 bits or more are converted to a 5-bit conversion code, which is used as the most significant bits. As a result, the total number of bits of the conversion tables 22 and 23 can be greatly reduced due to the fact that the demodulation of variable length codes of 9 bits or more is performed by designating the address of the conversion table 23 by a 12-bit code.

Obviously, the maximum bit length of the variable length code is not restricted to being 15 bits. Also, instead of supplying respectively the most significant 8 bits and least significant 7 bits to the two conversion tables, it is possible to split the variable length code at a suitably chosen bit number such as to obtain an optimum efficiency of reduction of the number of bits.

Figure 2:
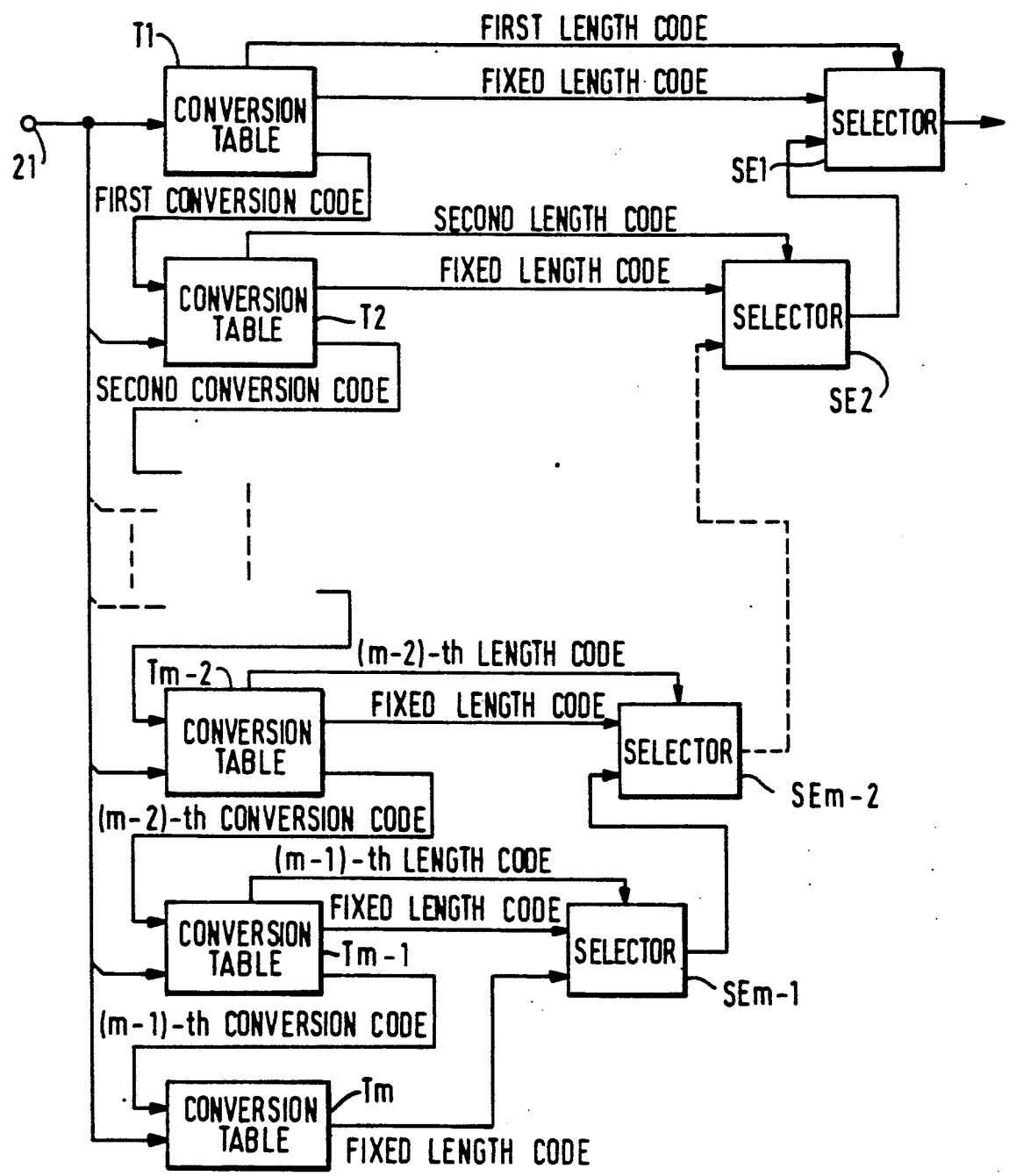
FIG. 2 is a basic block diagram of the variable length code demodulating apparatus of other embodiment of the present invention.
Figure 3A:
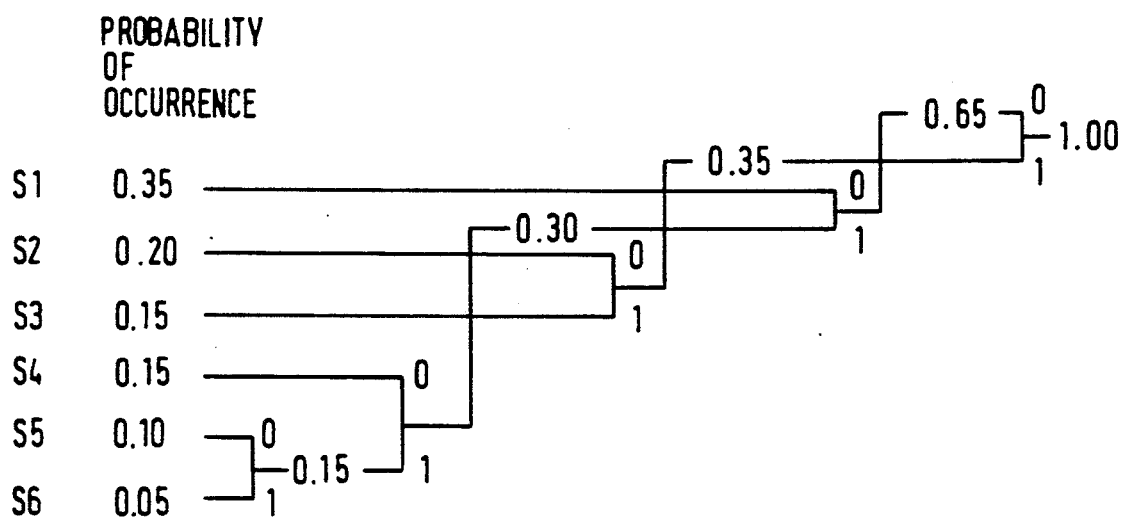
Figure 3B:
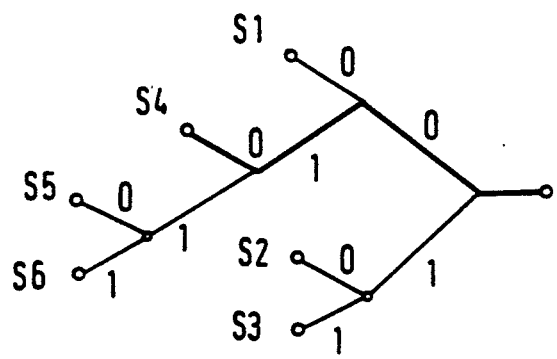

FIG. 2 shows a second embodiment of this invention. In the second embodiment, the same numerals are applied to similar elements in the first embodiment, and therefore the detailed description thereof are not repeated. The second embodiment is an example where m conversion tables are employed. The variable length code from the input terminal 21 is divided into first to $(m-1)$-th (where m is a natural number) most significant bits and least significant bits, which are supplied to respective conversion tables $T_1$ to $T_m$. From the conversion tables $T_1$ to $T_{m-1}$, first to $(m-1)$-th length codes and fixed length codes are respectively supplied to selectors $SE_1$ to $SE_{m-1}$. Furthermore, from the conversion tables $T_1$ to $T_{m-1}$, first to $(m-1)$-th conversion codes are respectively supplied to the conversion tables $T_2$ to $T_m$ of the next stage. The fixed length code from the conversion table $T_m$ is output to selector $SE_{m-1}$. The fixed length codes which are output from the selectors $SE_2$ to $SE_{m-1}$ are respectively input to the selectors $SE_1$ to $SE_{m-2}$ of the front stage. Thus, from the output terminal of the selector $SE_1$, a demodulated fixed length code is output corresponding to the variable length code.

As described above, with this invention, the total bit length of the conversion tables can be greatly reduced.

Numerous other modifications and variations of the present invention are possible in light of the above teachings. It is therefore to be understood that, within the scope of the appended claims, the present invention can be practiced in a manner other than as specifically described herein.

What is claimed is:

1. A variable length code demodulating apparatus of the type wherein the input variable length code is converted to a fixed length output code using a conversion table in which fixed length codes are stored by means of addressing, the apparatus comprising:
    a) means for converting the most significant bits having a selected bit length of said variable length code into a conversion code having a bit length smaller than the selected bit length;
    b) a conversion table having address inputs and connected to receive the least significant bits of said variable length bit code as least significant it address inputs thereto, and further connected to receive said conversion code as most significant bit address inputs, said conversion table generating a fixed length code smaller than the maximum bit length of said variable length code as said fixed bit output code;
    c) an additional conversion table connected to receive said most significant bits of said variable length code and for generating an additional fixed length code; and
    d) selector means for selecting said fixed length code as said fixed length output code when the bit length of said variable length code exceeds said selected bit length, and for selecting said additional fixed length code as said fixed length output code when the bit length of said variable length code does not exceed said selected bit length.

2. An apparatus as recited in claim 1, wherein said conversion table comprises a read only memory.

3. An apparatus as recited in claim 1, wherein the additional conversion table comprises a read only memory.

4. An apparatus as recited in claim 1, wherein said variable length code comprises a Huffman code.

5. A variable length code modulating apparatus of the type wherein an input variable length code is converted to a fixed length output code using conversion tables in which fixed length codes are stored by means of addressing, the apparatus comprising:
    a) a first conversion table connected for receiving said most significant bits of said variable length code as address inputs thereto and for converting said most significant bits of said variable length code into a first fixed length code, the most significant bits having a fixed bit length equal to a selected bit length smaller than a maximum number of bits in said variable length code,
    b) said first conversion table generating a conversion code corresponding to the most significant bit of each variable length code, said conversion code having a bit length smaller than said selected bit length,
    c) a second conversion table connected to receive the least significant bits of said variable length code as address inputs thereto and further connected to receive said conversion code, said conversion code fed as most significant bits to said address inputs of said second conversion table, said second conversion table generating a second fixed length code, and
    d) selector means connected to receive said first and second fixed length codes and operable to select, as said fixed length output code, said first fixed length code if the bit length of said variable length code does not exceed said selected bit length, and to select said second fixed length code if the bit length of said variable length code exceeds said selected bit length.

6. An apparatus as recited in claim 5, wherein said first and second conversion tables comprise a read only memory.

7. An apparatus as recited in claim 5, wherein said variable length code comprises a Huffman code.

8. A variable length code demodulating apparatus comprising:
    a first conversion table which inputs as address thereto first most significant bits of a variable length code, said variable length code comprising first to $(m-1)$-th (where m is a natural number) most significant bits and least significant bits, said first conversion table outputting a first length code that indicates whether the variable length code is or is not of longer bit length than the bit length of the first most significant bits, and operable when the variable length code has a bit length that is no greater than the bit length of the first most significant bits to convert the variable length code into a fixed length code and operable when the variable length code has a bit length that is longer that the bit length of the first most significant bits to convert the first most significant bits of the variable length code to a first conversion code which is shorter than the bit length of the first most significant bits;

second to (m−1)-th conversion tables which respectively output second to (m-1)-th length codes, second to (m−1)-th conversion codes and fixed length codes;

an (m−1)-th conversion table whose address is designated by the least significant bits of said variable length code and said (m−1)-th conversion code and operable to convert variable length codes of bit length longer than the total bit length of said first to (m−1)-th most significant bits to fixed length codes;

first to (m−1)-th selectors for first to m-th conversion table in response to said first to (m−1)-th length codes;

said second to (m−1)-th conversion tables connected to receive as address thereto the k-th most significant bits (where k is 2 to m−1) of the variable length code and the l-th (where l is 1 to m−2) conversion code, and operable to output second to (m−1)-th length codes that indicate whether or not the code which is input has a bit length that is longer than the total bit length of the bit length of the first most significant bits and the bit length of the first to (m−2)-th conversion codes, and operable such that when the input code is of bit length shorter than said total bit length, the input code is converted to a fixed length code and output, when the input code is longer than said total bit length, the second to (m−1)-th conversion code of shorter bit length than the total bit length is output.

9. A method for address controlling of a first and second conversion table of a demodulating apparatus supplied with a variable length code wherein fixed length codes corresponding to each variable length code are stored in the conversion tables, the method including the steps of:

a) designating a bit length as the most significant bits of said variable length code by selecting a bit length less than a maximum number of bits of said variable length code, and designating the remaining bits of said variable length code as least significant bits, b) if said variable length code has a number of bits exceeding said selected bit length,
  1) converting said designated most significant bits into a conversion code having a smaller bit length than said selected bit length, and
  2) replacing said most significant bits of said variable length code with said conversion code to form an input address for said second conversion table of said demodulating apparatus, and c) if said variable length code has a number of bits not exceeding said selected bit length, supplying said variable length code as an input address to said first conversion table of said demodulating apparatus.

10. A method for address controlling of conversion tables of a demodulating apparatus supplied with a variable length code wherein fixed length codes corresponding to each variable length code are stored in the conversion tables, the method including the steps of:

a) providing a first conversion table for receiving the most significant bits of said variable length code as address inputs thereto, b) converting the most significant bits of the variable length code into a first fixed length code, the most significant bits having a fixed bit length equal to a selected bit length smaller than a maximum number of bits in the variable length code, c) generating a conversion code corresponding to the most significant bit of each variable length code, the conversion code having a bit length smaller than said selected bit length, d) providing a second conversion table to receive the least significant bits of said variable length code as address inputs thereto and said conversion code, e) feeding said conversion code as most significant bits to said address inputs of said second conversion table, f) generating via said second conversion code a second fixed length code, and g) selecting as said fixed length output code said first fixed length code if the bit length of said variable length code does not exceed said selected bit length and said second fixed length code is the bit length of said variable length code exceeds said selected bit length.

* * * * *